(12) United States Patent
Winkler et al.

(10) Patent No.: US 9,921,552 B2
(45) Date of Patent: Mar. 20, 2018

(54) PLACEMENT APPARATUS AND PLACEMENT METHOD

(71) Applicant: FINETECH GmbH & Co. KG, Berlin (DE)

(72) Inventors: Matthias Winkler, Bannewitz (DE); Michael Koch, Wandlitz (DE)

(73) Assignee: FINETECH GmbH & Co. KG, Berlin (DE)

( * ) Notice: Subject to any disclaimer, the term of this patent is extended or adjusted under 35 U.S.C. 154(b) by 0 days.

(21) Appl. No.: 14/786,743

(22) PCT Filed: Apr. 24, 2014

(86) PCT No.: PCT/EP2014/058352
§ 371 (c)(1),
(2) Date: Oct. 23, 2015

(87) PCT Pub. No.: WO2014/174017
PCT Pub. Date: Oct. 30, 2014

(65) Prior Publication Data
US 2016/0091869 A1 Mar. 31, 2016

(30) Foreign Application Priority Data
Apr. 25, 2013 (DE) .......... 10 2013 207 598

(51) Int. Cl.
*G05B 1/03* (2006.01)
*H05K 13/08* (2006.01)

(52) U.S. Cl.
CPC .............. *G05B 1/03* (2013.01); *H05K 13/08* (2013.01)

(58) Field of Classification Search
CPC ................................. G05B 1/03; H05K 13/08
(Continued)

(56) References Cited

U.S. PATENT DOCUMENTS

| 5,699,193 A | 12/1997 | Monno et al. |
| 6,236,747 B1 * | 5/2001 | King ................. G01N 21/8806 348/92 |

(Continued)

FOREIGN PATENT DOCUMENTS

| DE | 242320 A1 | 1/1987 |
| DE | 19524475 C1 | 11/1996 |

(Continued)

OTHER PUBLICATIONS

Machine translation of DE 19749953 A1.*

*Primary Examiner* — Kawing Chan
(74) *Attorney, Agent, or Firm* — The Webb Law Firm

(57) ABSTRACT

The invention relates to a placement apparatus for the positionally accurate alignment and/or fitting of a first placement partner with at least one second placement partner complementary thereto, wherein the placement apparatus has at least one camera apparatus for recording separate images of the first placement partner or of a holding apparatus for the first placement partner and of the at least one second placement partner or of a holding apparatus for the at least one second placement partner and a position evaluation apparatus for creating an output data record from processing of the images, wherein the output data record has the visual image of the expected placement result. The invention also relates to a placement method.

17 Claims, 21 Drawing Sheets

(58) Field of Classification Search
USPC .......................................... 318/640, 638, 560
See application file for complete search history.

(56) References Cited

U.S. PATENT DOCUMENTS

| | | | | |
|---|---|---|---|---|
| 2002/0006219 A1* | 1/2002 | Hudson | ............. | H01L 21/67144 382/153 |
| 2012/0113318 A1* | 5/2012 | Galstian | ........... | B29D 11/00298 348/374 |
| 2013/0222579 A1* | 8/2013 | Lee | ........................ | G01C 11/02 348/135 |
| 2013/0286186 A1* | 10/2013 | Okada | ................ | H05K 13/0404 348/87 |

FOREIGN PATENT DOCUMENTS

| | | |
|---|---|---|
| DE | 19749953 A1 | 5/1999 |
| DE | 19857263 A1 | 3/2000 |
| WO | 0167491 A2 | 9/2001 |

* cited by examiner

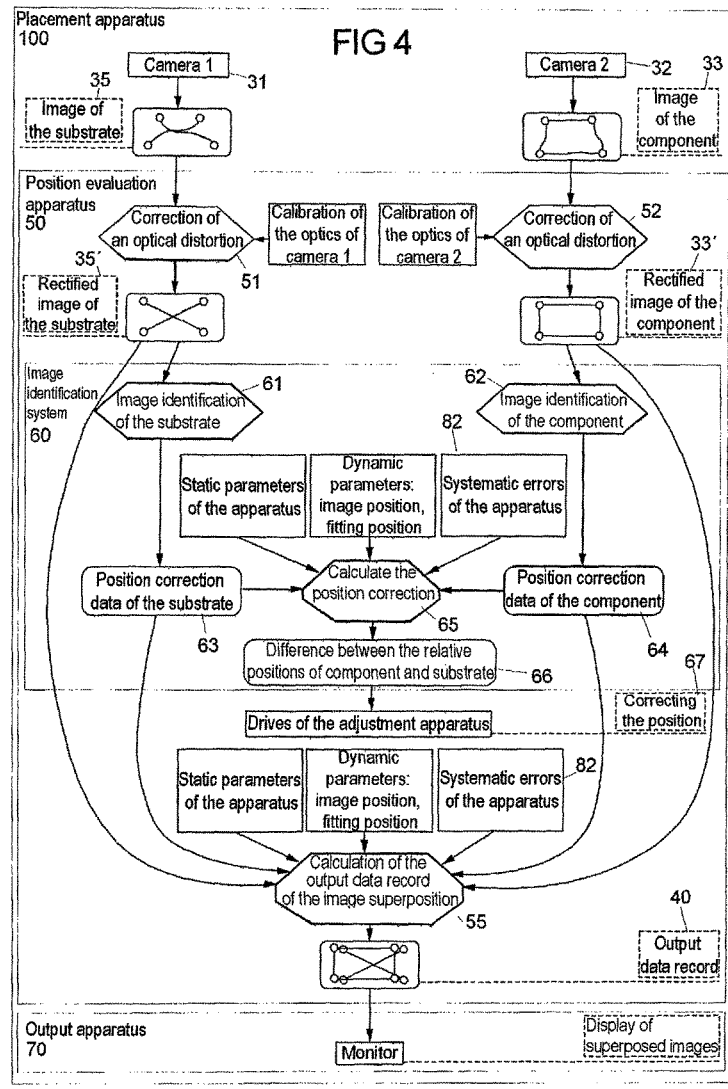

Figure 6A
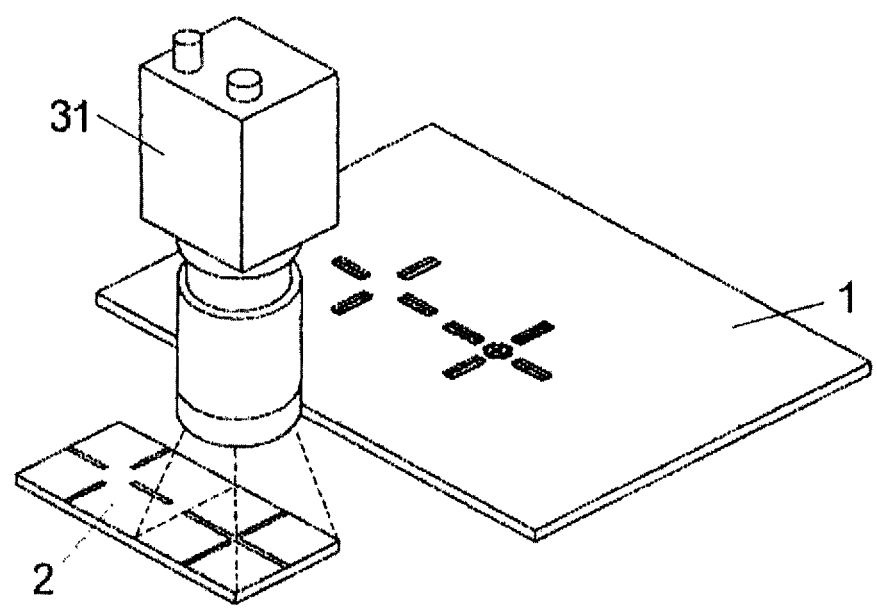
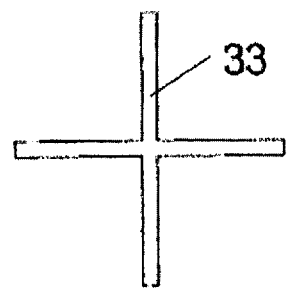

Figure 6B
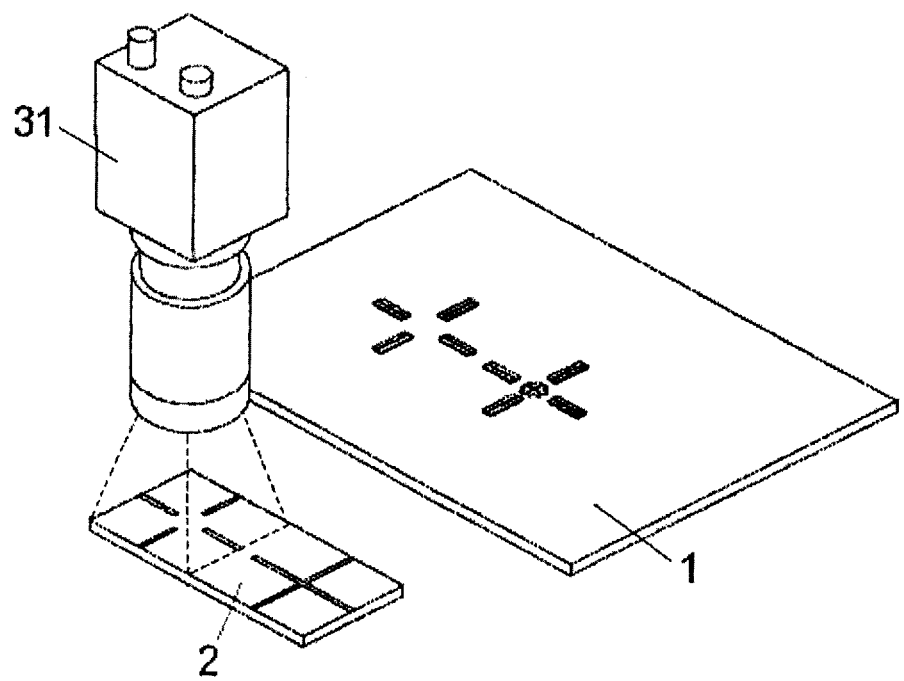
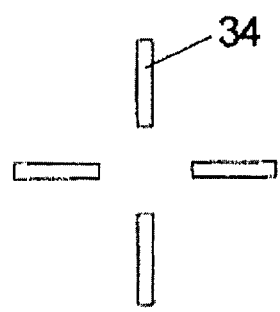

Figure 6C
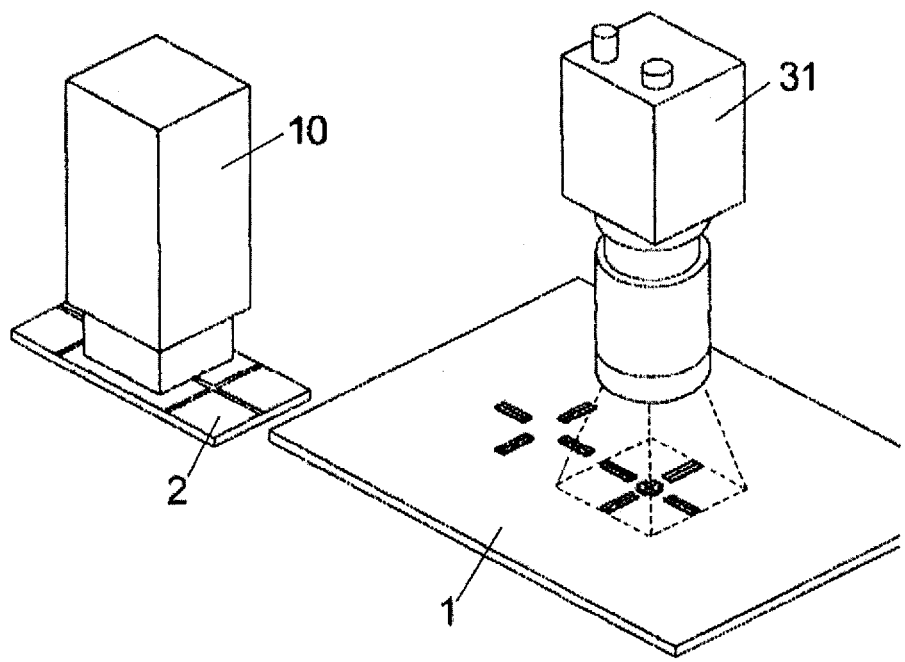
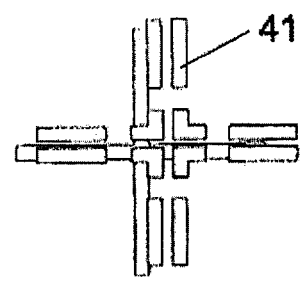

Figure 6D
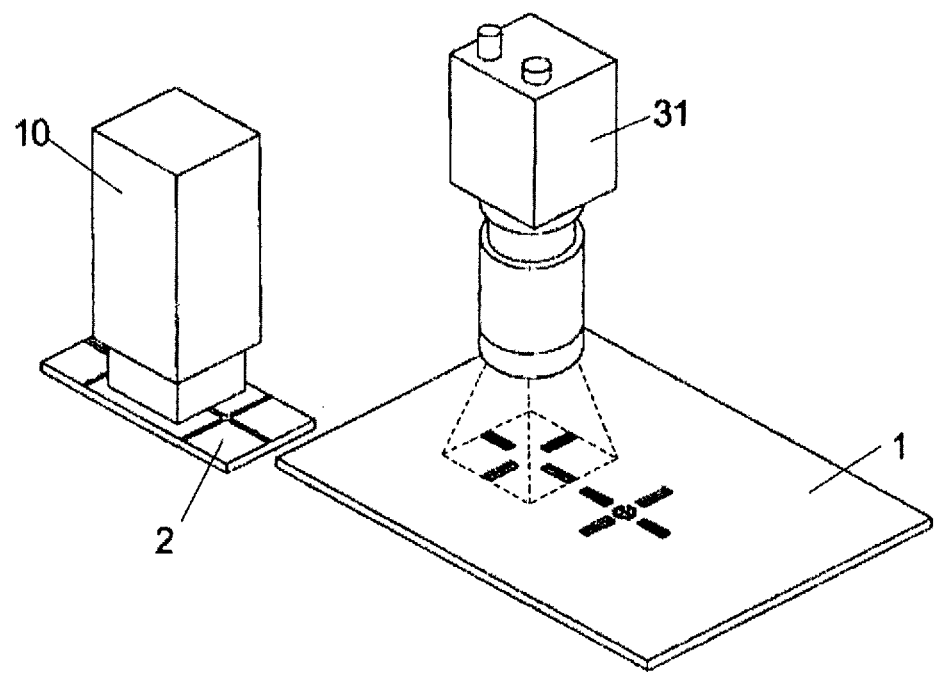
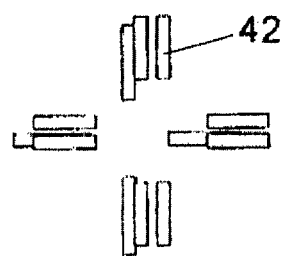

Figure 8C
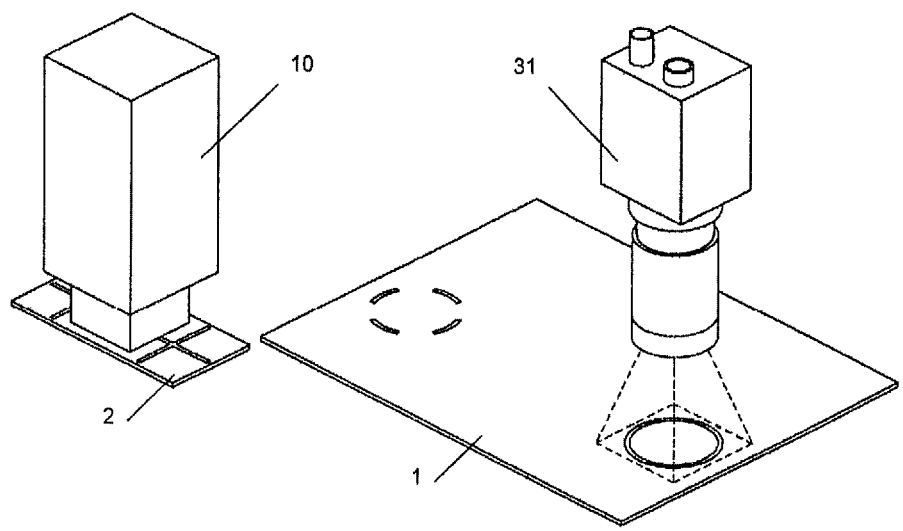
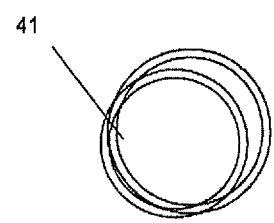

Figure 8D
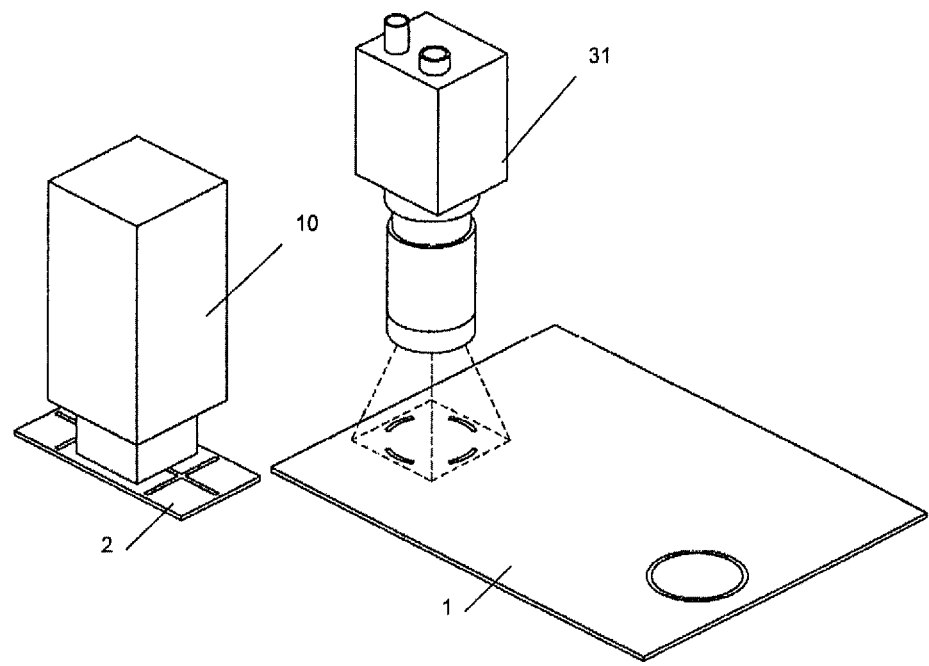
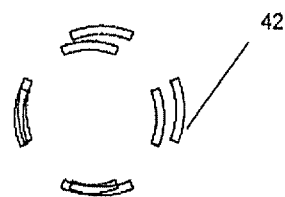

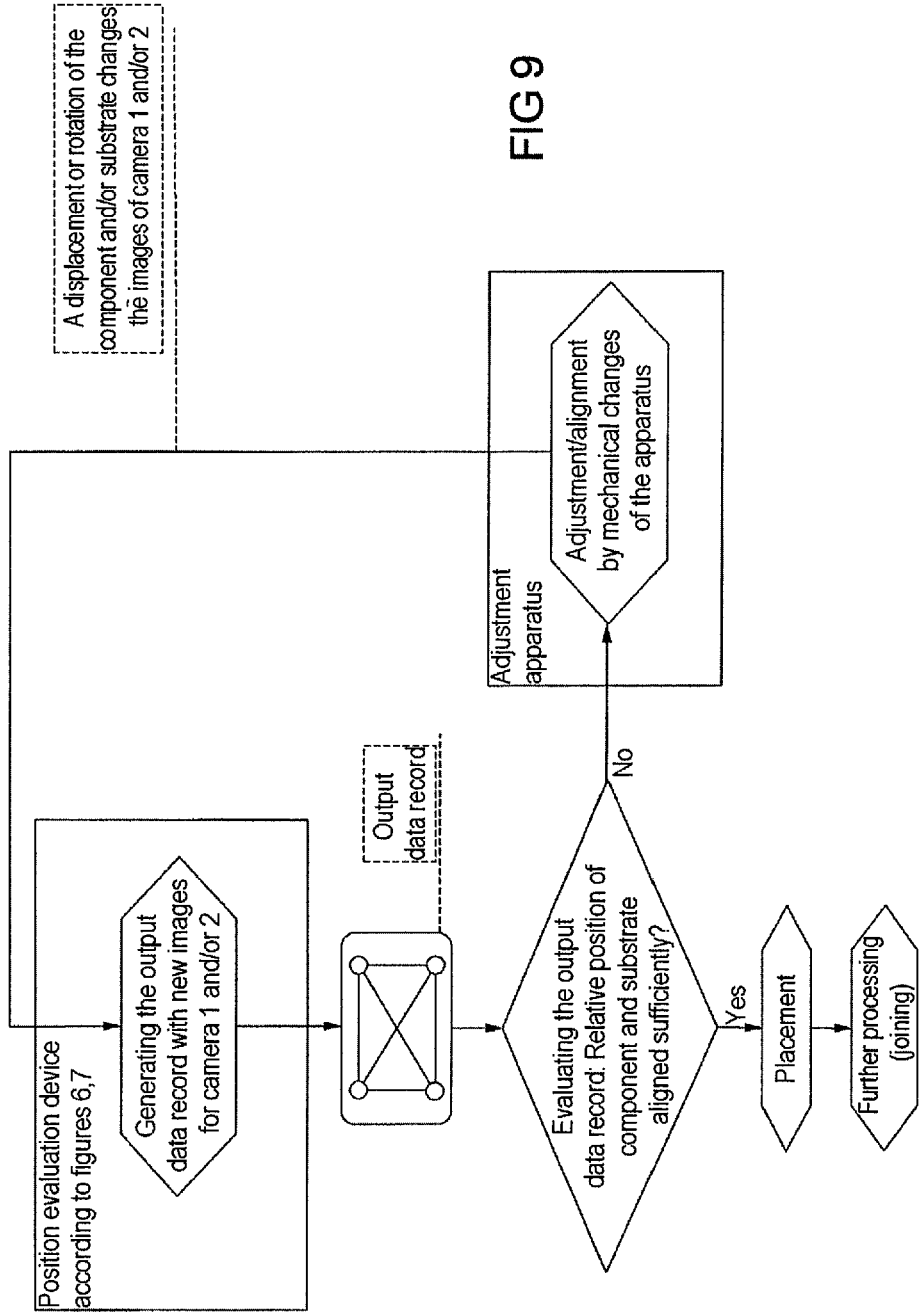

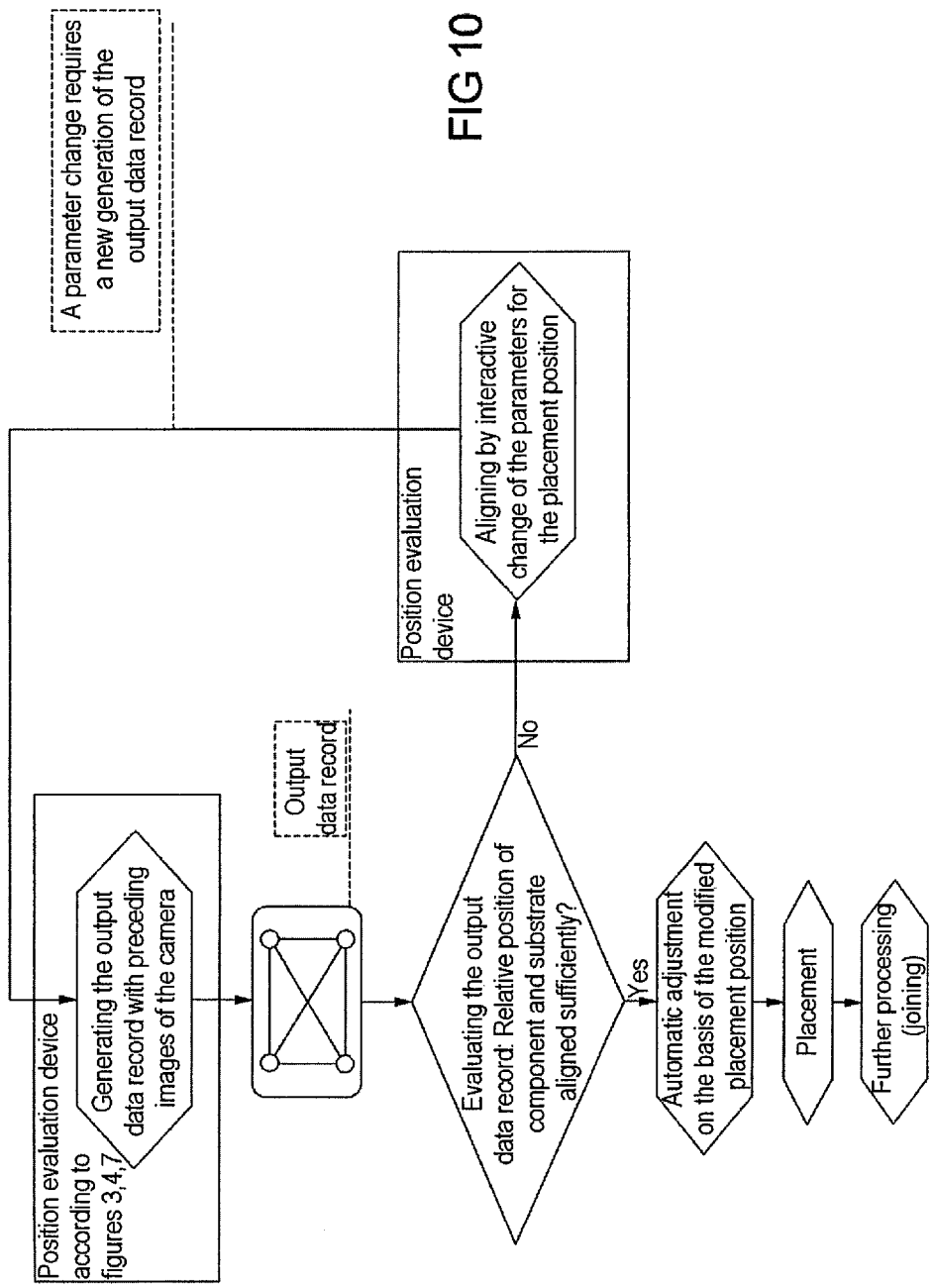

PLACEMENT APPARATUS AND PLACEMENT METHOD

CROSS-REFERENCE TO RELATED APPLICATIONS

This application is the United States national phase of International Application No. PCT/EP2014/058352 filed Apr. 24, 2014, and claims priority to German Patent Application No. 10 2013 207 598.7 filed Apr. 25, 2013, the disclosures of which are hereby incorporated in their entirety by reference.

BACKGROUND OF THE INVENTION

Field of the Invention

The invention relates to a placement apparatus for positionally accurate fitting of a first placement partner with a second placement partner and a placement method for positionally accurate fitting of a first placement partner with a second placement partner.

Description of Related Art

During the production of, in particular, electronic, optical and optoelectronic products and microsystems, there is the problem of automatically arranging components on a substrate. By way of example, the components can be memory components or microprocessors which must be disposed on a substrate. Other examples include the assembly of VCSEL components, photodiodes, MEMS components or chip-on-glass components.

Subsequently, there is further processing of the substrate together with the component. In particular, under certain circumstances, a permanent connection is established between substrate and component, e.g. by way of thermocompression, ultrasonic methods, soldering or adhesive bonding.

Placement apparatuses in which a component is disposed on a substrate with the aid of lever arms are known, for example from DD 242 320 A1 or DE 195 24 475 C1.

SUMMARY OF THE INVENTION

In order to be able to realize ever more accurate placements, there is a need for placement apparatuses and methods which are simple and efficient, both in production and use.

Here, at least one camera apparatus serves to record separate images of the first placement partner or of a holding apparatus of the first placement partner and of the at least one second placement partner or of a holding apparatus for the at least one second placement partner. Thus, images of the placement partners or of the respective holding apparatuses are recorded. Furthermore, a position evaluation apparatus serves to create an output data record from processing the images, wherein the output data record has the visual image of the placement result to be expected.

Here, the placement apparatus serves for positionally accurate alignment and/or fitting of a first placement partner with at least one second placement partner complementary thereto. Complementary means that, during the assembly, the two placement partners fit together.

Advantageously, the first placement partner has a substrate and the at least second placement partner has at least one component. Depending on the assembly situation, a component can be placed onto a substrate, and vice versa. It is also possible that it is not only the substrates and components that are placed but also, furthermore, that additional parts can be arranged at the two placement partners. In any case, the placement partners are complementary to one another.

In an advantageous embodiment, a first camera apparatus is embodied as a substrate camera apparatus for recording images of the substrate and a second camera apparatus is embodied as a component camera apparatus for recording images of the lower side of the component.

By way of an adjustment apparatus for the relative alignment of the placement partners (e.g. substrate and component), these can be moved relative to one another in at least one spatial direction and/or rotational direction in order to obtain an accurate placement result. These movements can preferably be carried out by motor-driven shafts or other mechanisms, with the term shaft being used for this in the following.

Advantageously, the placement apparatus has a number of correction means. A first correction means minimizes imaging errors, in particular distortions, in the images of the camera apparatuses by means of calibration data. A second correction means serves for calculative combining of mechanical errors of the placement apparatus with calibration data.

The correction means can be used individually or in any combinations amongst themselves.

A position evaluation apparatus serves to create an output data record from processing the previously obtained images, wherein the output data record includes a superposition of the images for display on an output apparatus. In this case, the output data record visualizes the placement result of the apparatus to be expected, in particular the placement position and rotation. As a result of this, e.g. an installation operator is able quickly to identify whether the placement of the placement partners (e.g. component and substrate) would be carried out correctly.

A further embodiment of the placement apparatus comprises a means for generating graphical objects and displaying the latter in the output data record. Displaying these objects is a further option for evaluating the output data record, in particular in significant image positions, at which the placement partners do not have information, or not enough identifiable information, for the assessment of the placement result by the installation operator.

An apparatus for adjusting and aligning the position of the component relative to the substrate is based on the use of the output data record in a closed cycle, wherein changes in the mechanical position of the placement partners (e.g. of component and/or substrate) lead to modified images from the respective camera apparatus and these changes in turn are reflected in the output data record. The cycle ends with the decision, e.g. by the installation operator, that the visual image of the output data record constitutes a sufficiently accurate positioning of the placement partners. Subsequently, the placement apparatus with the set adjustment can carry out an exact fitting operation. Here, use is made of a means for aligning and adjusting which, for example, may be embodied as a manual controller.

A further advantageous apparatus for adjusting and aligning the position of the second placement element (e.g. a component) relative to the first placement element (e.g. a substrate) is based on the use of the output data record in a closed cycle, wherein the adjustment is carried out by continuously generating the output data record after adapting parameters of the placement position. Therefore, there are neither changes in the mechanical position of the placement partners and nor are new images thereof recorded during the cycle. The cycle ends with the decision, e.g. by the installation operator, that the visual image of the output data record constitutes a sufficiently accurate positioning of the placement partners. Subsequently, the placement apparatus with the set adjustment can carry out an exact fitting operation.

In a further embodiment, generating and displaying the output data record is brought about in real time such that an operator is put into the position to carry out without delay, by way of an adjustment apparatus, a spatial adjustment of the at least two placement partners in relation to one another, depending on the visual image of the output data record.

A further embodiment has an adjustment apparatus by means of which a mutual spatial setting of the at least two placement partners is brought about automatically, by way of example using an image identification system, wherein the output data record visualizes the result of the automatic setting even before the placement apparatus has assumed this position.

Moreover, the placement apparatus has a means for disposing the one placement partner on the other one, preferably realized by motor-driven shafts or other mechanisms. Here, processing of the subsequently set placement positions is carried out taking into account the output data record and further known parameters of the apparatus.

In a further embodiment, provision is made for a means for further processing of the placement partners (e.g. component and substrate), in particular a means for establishing a permanent connection between the substrate and component by thermocompression, ultrasonic methods, soldering and/or adhesive bonding.

BRIEF DESCRIPTION OF THE DRAWINGS

Below, exemplary embodiments of the invention are depicted on the basis of drawings and block diagrams. In detail:

FIG. 4 shows a block diagram of an embodiment of a placement apparatus and a placement method to be carried out thereby for generating and displaying an output data record in the form of superposed images of the substrate and component, carried out with corrections of imaging and mechanical errors, coupled to an image identification system;

FIGS. 6A-6F shows an embodiment of a placement method with a component relative to a substrate, wherein the output data record is created at a plurality of camera positions;

FIGS. 8A-8G shows an embodiment of a placement method with a component relative to a substrate, wherein the output data record is created at a plurality of camera positions and, additionally, synthetically generated graphical objects are applied;

FIG. 9 shows a block diagram of an embodiment of a placement apparatus and a placement method to be carried out thereby for adjusting and aligning the position of the component relative to the substrate by updating the movable shafts of the adjustment apparatus; and FIG. 10 shows a block diagram of an embodiment of a placement apparatus and a placement method to be carried out thereby for adjusting and aligning the position of the component relative to the substrate by aligning visual images in the output data record.

In the following figures, embodiments are described in which the placement partners 1, 2 are a substrate 1 and a component 2. Here, the assumption is made that the component 2 is disposed on the substrate 1. However, in principle, it is also possible for the substrate 1 to be disposed on the component 2.

DETAILED DESCRIPTION OF THE INVENTION

Figure 1:
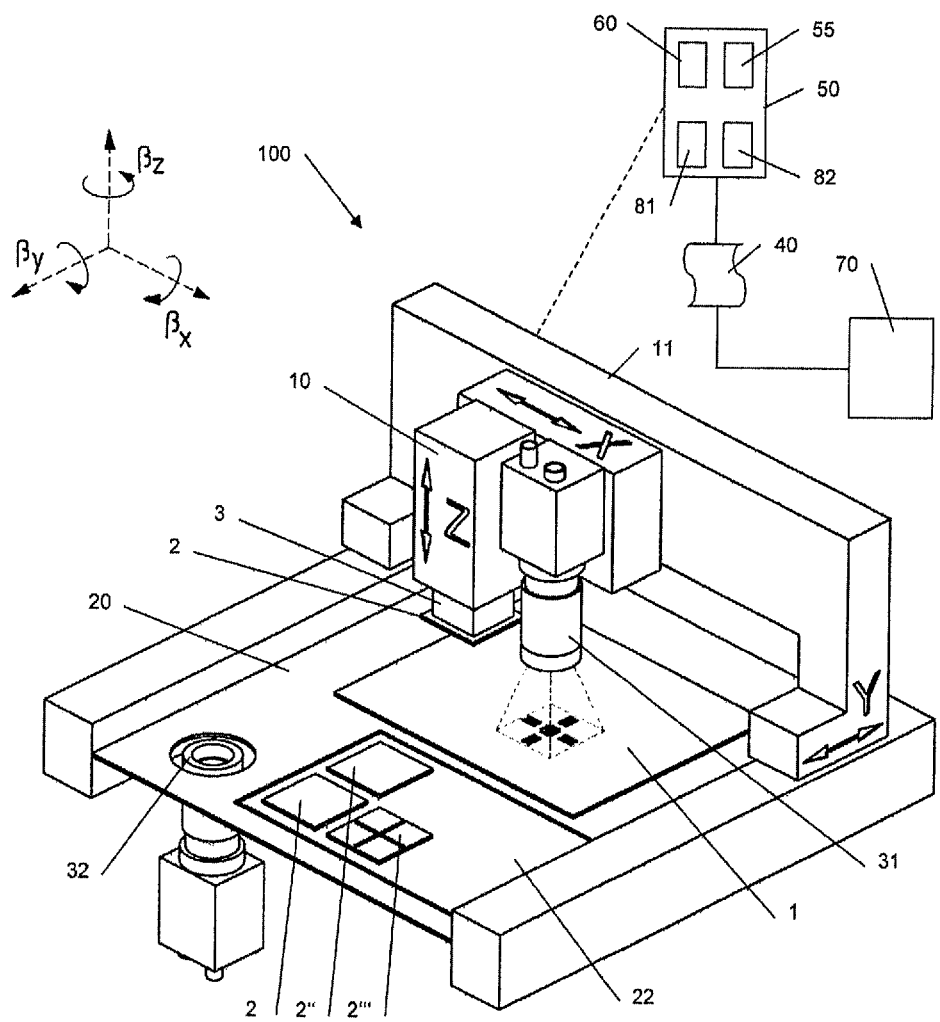
FIG. 1 shows a perspective illustration of an embodiment of a placement apparatus.

FIG. 1 depicts an embodiment of a placement apparatus 100. Such placement apparatuses 100 are used to arrange a component 2 on a substrate 1. Here, the component 2 is arranged at a holding apparatus 3 under a placement unit 10 at a portal 11; the substrate 1 is arranged on a base 20. In this case, the base 20 serves e.g. as holding apparatus for the substrate 1.

In the embodiment described here, a substrate camera apparatus 31 is arranged in a movable manner, in particular at the portal 11.

This presentation method is maintained in the following for reasons of clarity, with it being possible, in principle, for the substrate 1 to be arranged at the placement unit 10 and for the component 2 to be lying on the base 20.

In any case, the component 2 and substrate 1 are brought to one another by a movement as placement partners 1, 2, with, in principle, it being irrelevant whether it is the component 2 and/or the substrate 1 that is moved.

The placement unit 10 at the portal 11 can be displaced in the longitudinal and transverse directions (X- and Y-directions in FIG. 1) of the placement apparatus 100. Additionally, the placement unit 10 can also be displaced in the vertical direction (Z-direction in FIG. 1).

Components 2', 2", 2'" prepared for placement lie in a storage region 22. When the placement unit 10 travels into this storage region 22, the placement unit 10 can be displaced downward in the vertical direction such that one of the components 2', 2", 2'" can be received in order subsequently to be placed onto the substrate 1. In principle, the storage region 22 can also be arranged at a different location, in particular outside of the placement apparatus 100 as well.

For the required precision of the placement, it is necessary that the design and setup of the placement apparatus 100 and the alignment of the component 1 in relation to the substrate 2 are carried out very accurately. This is the only way that a high repetition accuracy is achievable in the case of a sequence of placement processes.

Camera apparatuses 31, 32 are used for the accurate relative alignment of the placement unit 10 and the substrate 1.

Arranged at the placement unit 10 is a substrate camera apparatus 31 as a first camera apparatus, the lens of which points downward such that the base 20 with the substrate 1 lying below the portal 11 can be acquired. The substrate camera apparatus 31 records an image of the substrate 1 onto which the component 2 is intended to be disposed. This image recorded from above is subsequently fed to the position evaluation apparatus 50.

A component camera apparatus 32 serves as a second camera apparatus 32 which, in the depicted embodiment, is arranged in a stationary manner in the base of the placement apparatus 100, with the lens pointing upward.

The placement unit 10 receives a component 2 from the storage region 22—as described above—and moves it over the component camera apparatus 32. The latter records an image of the component 2, e.g. a chip with the connectors thereof, and feeds the image to a position evaluation apparatus 50.

The above-described method and an analogous apparatus can also be used to receive a component 2', 2'', 2''' from the storage region 20 and, in an intermediate step, align it exactly in relation to a tool, situated at the placement unit 10, as a holding apparatus. Subsequently, it is not the component 2', 2'', 2''' itself but rather the tool as the holding apparatus 3 that can be aligned exactly in relation to the substrate 1 in this case. This method is preferably applied when the component has the structures relevant for the alignment on the top side thereof, as indicated in the component 2'''.

Figure 2:
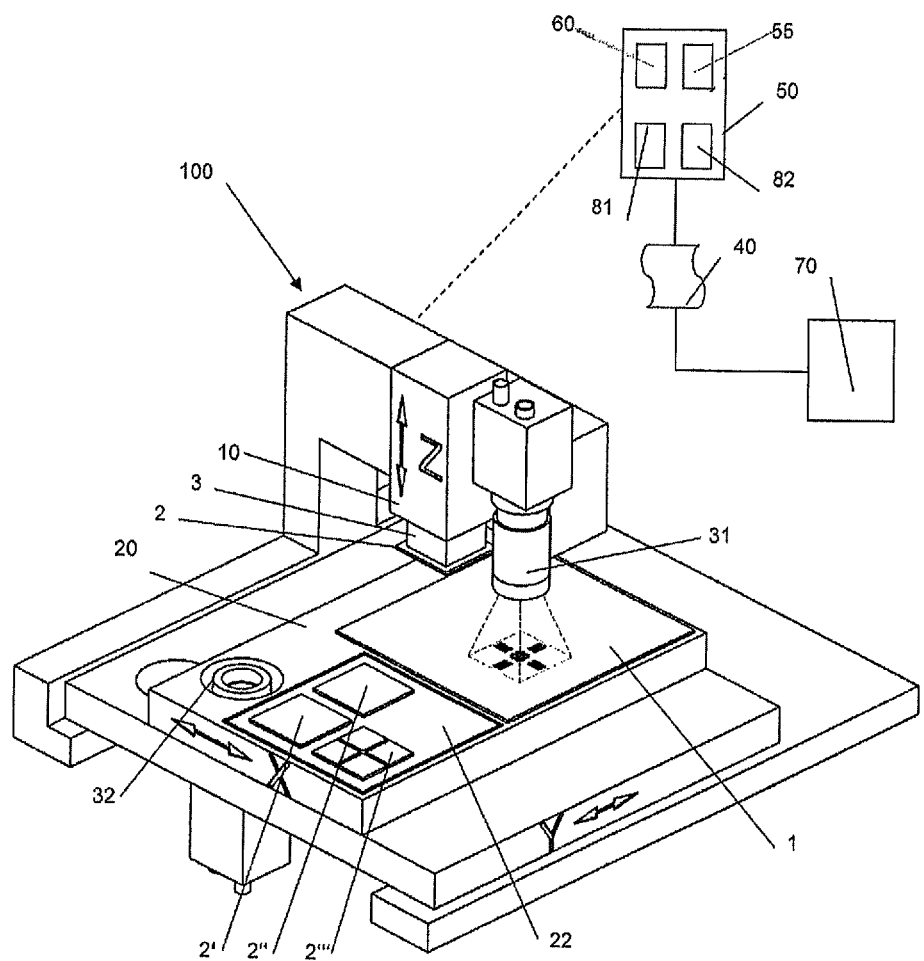
FIG. 2 shows a perspective illustration of a further embodiment of a placement apparatus.

FIG. 2 shows a further embodiment of a placement apparatus, in which the substrate 2 can be moved in the X- and Y-directions, while the component 1 can only be moved in the Z-direction.

In addition to the embodiments shown in FIG. 1 and FIG. 2, arbitrary divisions of the axis movements X, Y and Z between the substrate and component which ensure an alignment and placement of component and substrate are possible, wherein the camera apparatuses 31, 32 can be arranged both in a stationary and in a co-moving manner.

It is also possible to carry out rotations βx, βy and βz (indicated in the coordinate system of FIG. 1) of the substrate and/or component. It should be noted here that the rotations can, in principle, be carried out by one or more parts of the placement apparatus.

Figure 3:
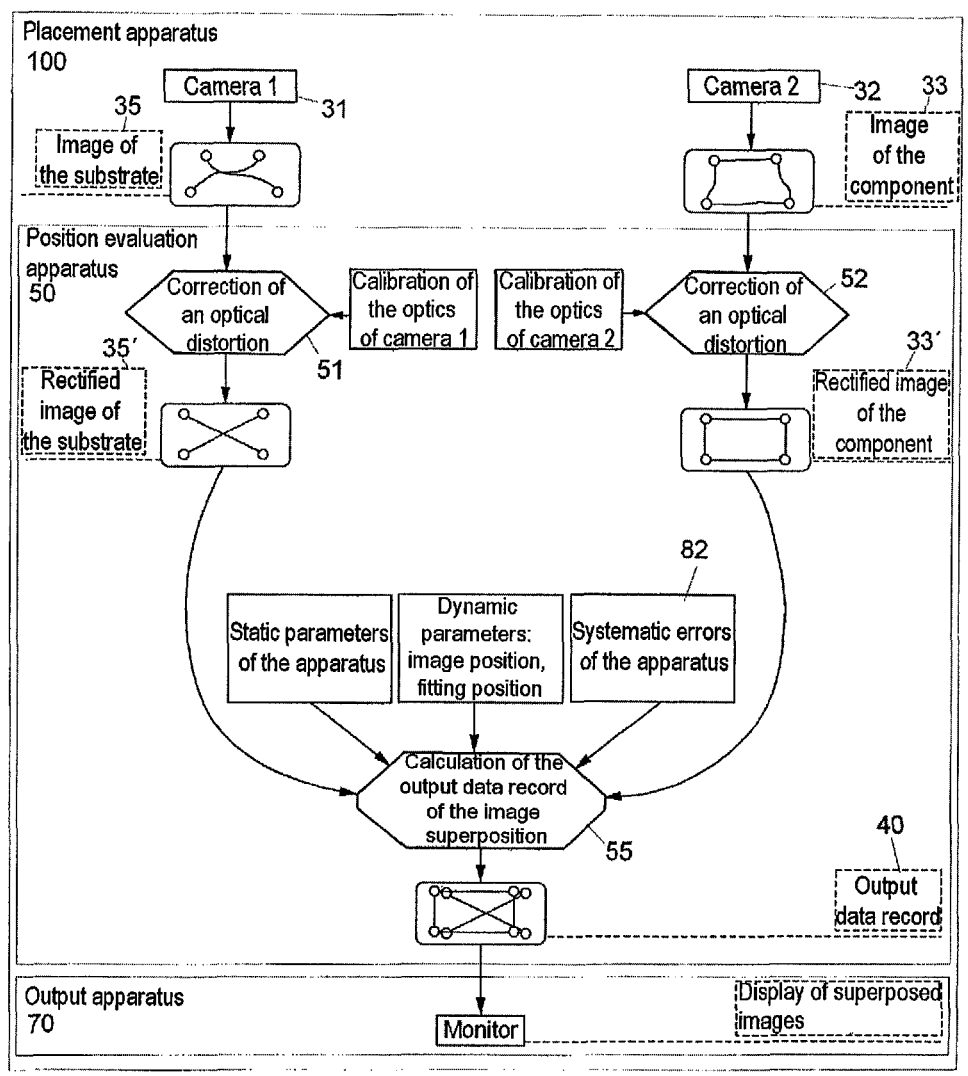
FIG. 3 shows a block diagram of an embodiment of a placement apparatus and a placement method to be carried out thereby for generating and displaying an output data record in the form of superposed images of the substrate and component, carried out with corrections of imaging and mechanical errors.

FIG. 3 shows a block diagram of an embodiment of a placement apparatus and a placement method to be carried out thereby for generating and displaying an output data record 40. In the illustration of the data flow for processing the camera images of the camera apparatuses 31, 32, these are respectively designated as "camera 1" and "camera 2" in FIGS. 3 and 4.

The assumption is made that, in one of the above-described placement apparatuses 100, the first camera apparatus 31 as a substrate camera apparatus records an image of a substrate 35 and the second camera apparatus 32 as component camera records the image of a component 33. It should be noted that it is irrelevant whether the images of the placement partners are recorded by one, two or more camera apparatuses 31, 32.

The images from the camera apparatuses 31, 32 are initially processed by correction steps 51, 52 in order to minimize the effects of geometric imaging errors, in particular distortions. By applying the correction means 81, rectified images 35', 33' of the substrate 1 and component 2 are created.

Subsequently, the step of generating the output data record 40 is carried out. A computer-implemented algorithm 55 calculates a superposed image of the placement partners 1, 2 for the supplied images 35', 33' of the substrate 1 and the component 2 with the aid of further special parameters. Here, the supplied images are subjected to geometric and image-related change, in particular displacement, rotation and distortion, as well as changes in color and transparency.

The algorithm has the requirement of superposing the supplied images in such a way that the visual image of the placement result to be expected is imaged. In order to realize this, special parameters are supplied for carrying out the operation, which parameters are classified as follows:

Static parameters of the apparatus comprise all relevant settings of the applied embodiment of a placement apparatus which are known or acquired in advance or calibrated in any other way in an unchanging manner and in a manner independent of the joining process. In particular, these parameters are zero positions of shafts and spatial positions of fixed camera apparatuses relative to one another or relative to a set zero point. Furthermore, parameters are applied for the pixel scale of the supplied images 35' 33'.

The dynamic parameters comprise influencing variables which are acquired when carrying out the process for adjusting and aligning. These include, in particular, the spatial position of movable camera apparatuses at the time of the respective image acquisition and relevant shaft positions, for example those of the placement unit 10.

Systematic errors of the placement apparatus 100 can additionally be fed to the algorithm and processed (correction means 82) in a further advantageous embodiment. These parameters contain known positioning errors during the process of disposing one placement partner 1, 2, for example linearity deviations in shafts and guides as a result of mechanical tolerances and/or influences of temperature. Calculative combining of the systematic errors generally only exhibits a small effect in the output data record; nevertheless the use thereof in the algorithm is decisive for realizing the requirement.

All aforementioned parameters are acquired and fed to the algorithm in a suitable form.

The result of the operation is the output data record 40, comprising an image which consists of a plurality of superposed camera images based on the state of the placement apparatus at the respective time of the image recording of the images 35', 33'. Therefore, the output data record 40 represents a visual illustration of the placement result to be expected of the placement partners under the given conditions. What is remarkable here is that the placement apparatus 100 need not yet be in the disposing position; rather, one and/or both placement partners 1, 2 can still be situated over the camera apparatuses 31, 32.

The camera images used for generating the output data record 40 may in each case also be recorded at a plurality of positions. Therefore, feeding further camera images increases the output data record 40, based on the camera positions assigned to the images. Thus, for example, the complete contact area of a component 2 can be imaged in the output data record 40 from the composition of a plurality of partial images from different recording positions.

The output data record 40 is indicated in a suitable form in an output apparatus 70, for example a monitor.

In an advantageous embodiment, tools can moreover be available to the installation operator for manipulating the output data record, which tools serve to improve the identifiability of the placement partners 1, 2, for example tools for magnifying/reducing the image and for changing the transparency.

In a further embodiment, the output data record 40 can be stored in order to generate verifiable proof of the placement position of the placement partners 1, 2, for example for the purposes of quality control.

FIG. 4 describes a further embodiment in accordance with FIG. 3, expanded by automatic image processing.

Like in the embodiment in accordance with FIG. 3, a rectified image of the substrate 35' and a rectified image of the component 33' are also generated in this case.

These rectified images 35', 33' are then transmitted to an image identification system 60, which is coupled to the position evaluation apparatus 50.

Here, there is respectively one image identification 61, 62 for each of the images 35', 33', in which e.g. marks are evaluated for calculating the current position of a placement position and a component. The position correction data 65 are subsequently calculated using the obtained position of the placement partners and the programmed placement position. Additionally, an advantageous embodiment can take into account the systematic errors of the placement apparatus (correction means 82). The result of this operation (66) is the difference between the relative positions of the component and substrate, in relation to the programmed placement position.

These data 66 then enable the automatic position correction 67 by way of an adjustment apparatus contained in the placement apparatus 100, which adjustment apparatus enables movements in the spatial directions X, Y, Z and/or in the rotational directions βx, βy and βz.

Proceeding from the rectified images 35', 33', an output data record 40 in the form of superposed images is generated parallel to the processing in the image identification system. The output data record 40 is generated analogously to the illustration and description of FIG. 3. Additionally, the position correction data of the individual placement data, obtained by the image identification, are used here as further parameters when carrying out the algorithm for generating the output data record 40.

Consequently, the output data record 40 shows, in relation to the programmed placement position, the placement result to be expected of the component 2 on a substrate 1, even though the calculated position correction of the image identification system has not yet been carried out by the adjustment apparatus.

Analogously to the description of FIG. 3, the output data record 40 can be stored and/or displayed in the output apparatus 70.

FIGS. 5A-5E depict different stages of placing a component 2 on a substrate 1. Such a placement method is possible, for example, using a placement apparatus 100 in accordance with FIG. 1 or FIG. 2.

Figure 5A:
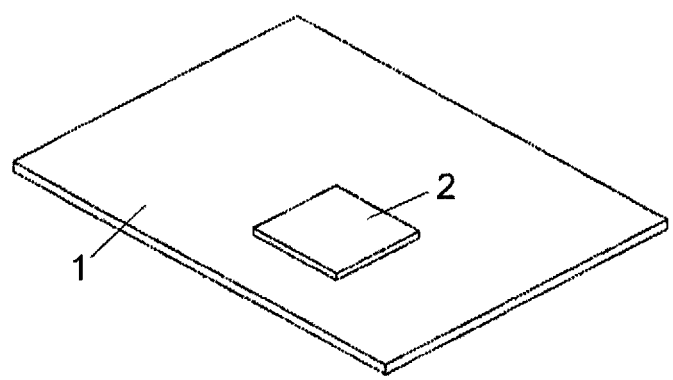
FIGS. 5A-5E shows an embodiment of a placement method with a component relative to a substrate.
Figure 5B:
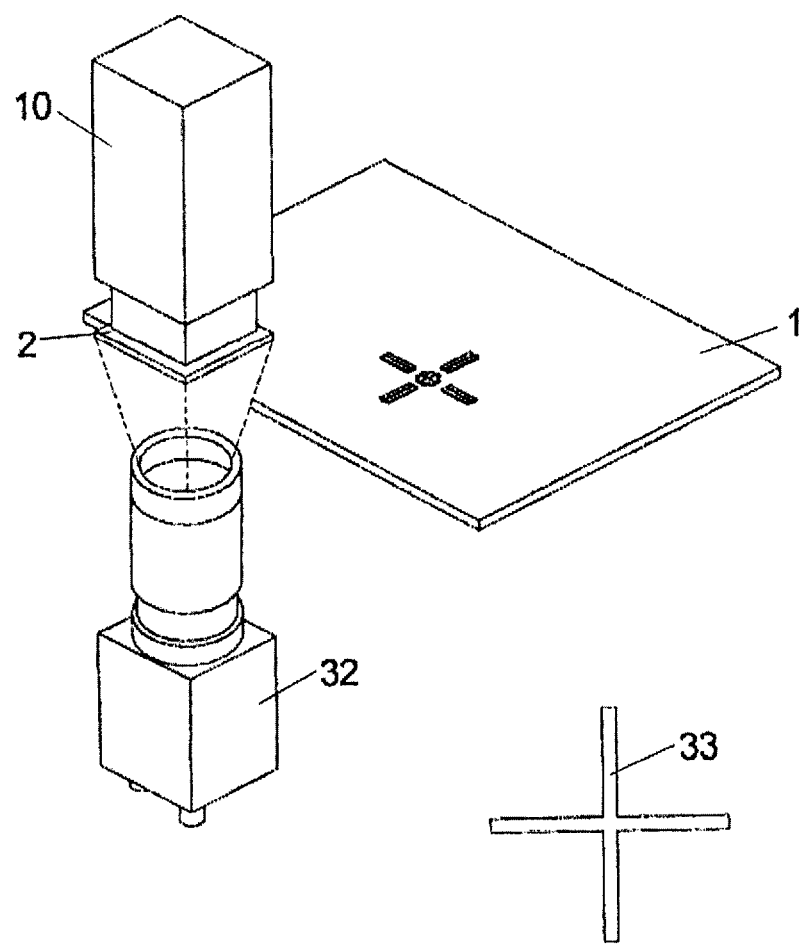
Figure 5C:
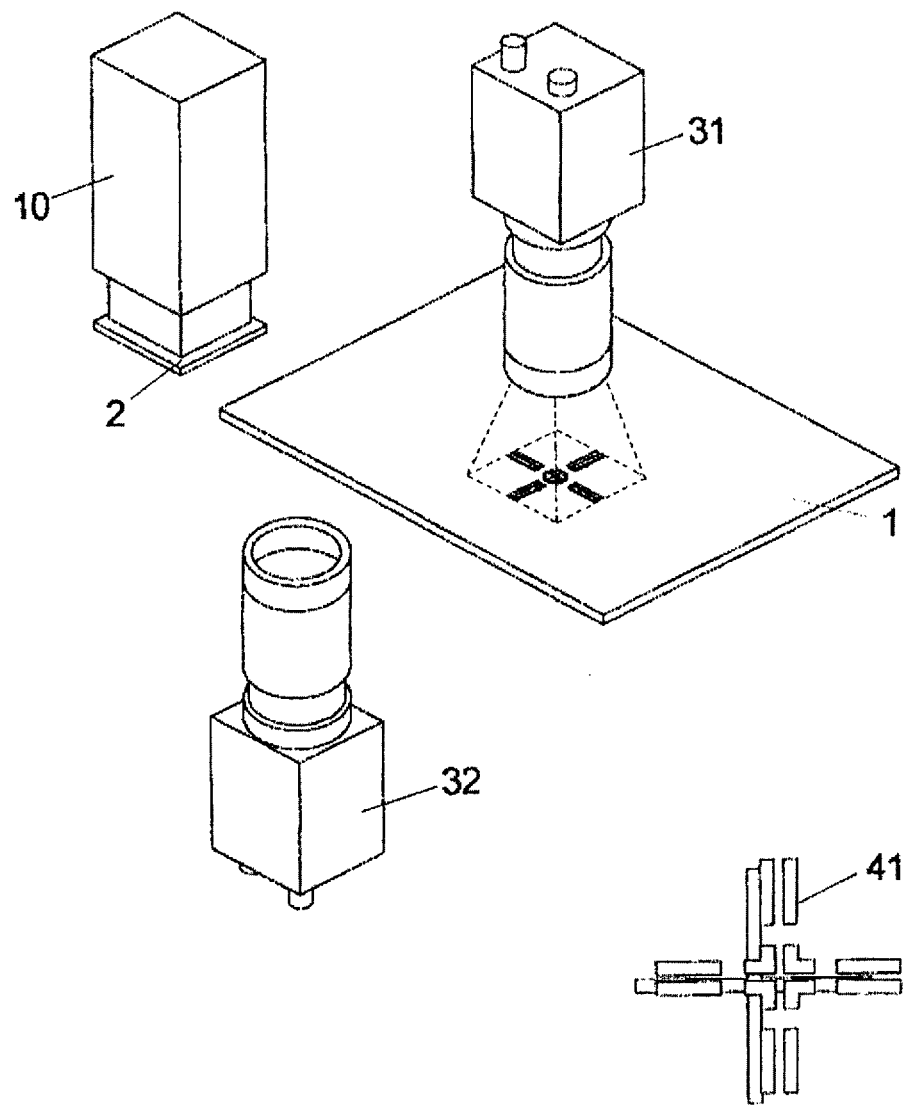
Figure 5D:
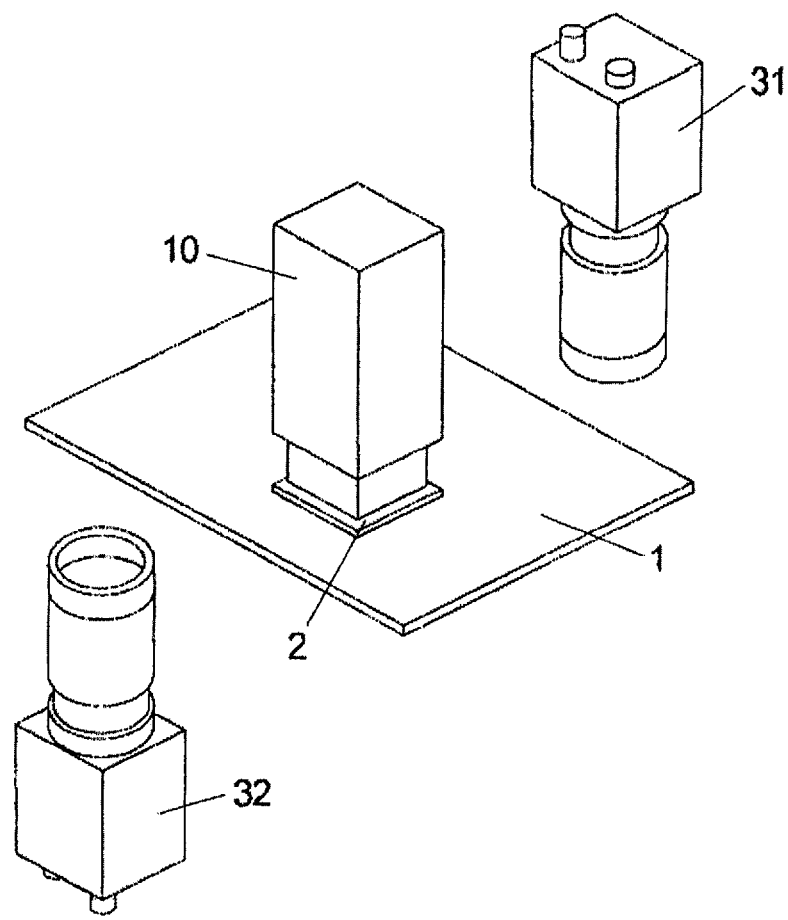

FIG. 5A depicts the desired placement result. Here, the assumption is made that the component 2 is arranged with the contacts pointing downward ("facedown") on the substrate 1.

After the placement unit 10 (FIG. 1/FIG. 2) has taken a component 2 from the storage region 22 (FIG. 1/FIG. 2), component 2 and component camera apparatus are moved toward one another (FIG. 5B) and the component camera apparatus 32 records an image 33 of the lower side of the component 2.

The position onto which the component 2 is intended to be disposed is identifiable on the substrate 1.

In the next step (FIG. 5C), this position is recorded by the substrate camera apparatus 31 and an image of the substrate position is obtained.

When now the image 33 of the component, recorded by the component camera apparatus 32, and the image of the substrate, recorded by the substrate camera apparatus 31, are fed to the method for generating the output data record 40 in a manner analogous to FIG. 3, a superposed image 41, which is depicted on the output apparatus 70, is made available. Here, it is possible to correct by way of correction means 81, 82 both specific errors of the images 35, 33 and the superposition positions thereof in relation to one another in advance, as described above in relation to FIG. 3 and FIG. 4.

Consequently, the installation operator can see and assess the placement result to be expected on the basis of the superposed image 41, even though the partial images were not recorded at the same times. The alignment of component in relation to substrate should be improved with the aid of an adjustment apparatus for as long as the displayed placement position does not meet the requirements. To this end, use can be made of methods according to FIG. 7 or FIG. 8.

Subsequently (FIG. 5D), the final placement position is traveled to and the placement unit 10 places the component onto the substrate.

Figure 5E:
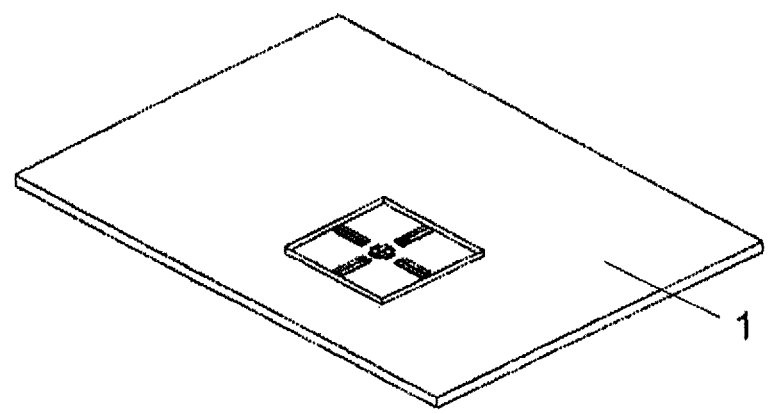

FIG. 5E depicts the final placement result, with the component 2 being depicted transparently in this case.

FIGS. 6A to 6F describe an embodiment of a placement method which differs from the embodiment from FIG. 5 to the extent that a larger component 2 is used in this case. This means that the camera apparatus 31 cannot record the image 33 of the component 2 from one position. Moreover, the component 2 is placed on a substrate 1 with a "face up" orientation in this case, i.e. the component upper side is aligned with the upper side of the substrate 1. Therefore, all individual images of both the substrate 1 and the component 2 can be recorded by a single camera apparatus 31, although this is not mandatory.

In FIG. 6A, a camera apparatus 31 records a first image 33 of the component 2 from a first position.

FIG. 6B depicts that the camera apparatus and/or the component were displaced in such a way that the camera apparatus 31 records a second image 32 at a different point of the component 2. It should be noted that, in this case, the second image 34 of the component 2 differs from the first image 33; this need not always be the case.

Since the component 2 is larger, the placement position on the substrate 1 is also larger.

In FIG. 6C, a first recording of the substrate position is made by the camera apparatus 31 from a first position. The superposition of this image with the first image 33 of the component 2 recorded previously results in a first superposed image 41 in the output data record 40.

In FIG. 6D, this process is then repeated at a second substrate position. Here, a second superposed image 42 emerges in the output data record 40. This process could be repeated at any number of further camera positions.

The output data record 40, composed of the superposed images 41, 42 and possibly further images, can be displayed to the installation operator, with suitable tools for displaying the overall view or portions of the output data record of interest being available (description analogous to FIG. 3). Furthermore, some or all recorded images 33, 34 etc. can also be subjected to corrections by correction means 81, 82 in this case.

Subsequently (FIG. 6E), the final placement position is traveled to and the placement unit 10 places the component 2 onto the substrate 1.

Figure 6E:
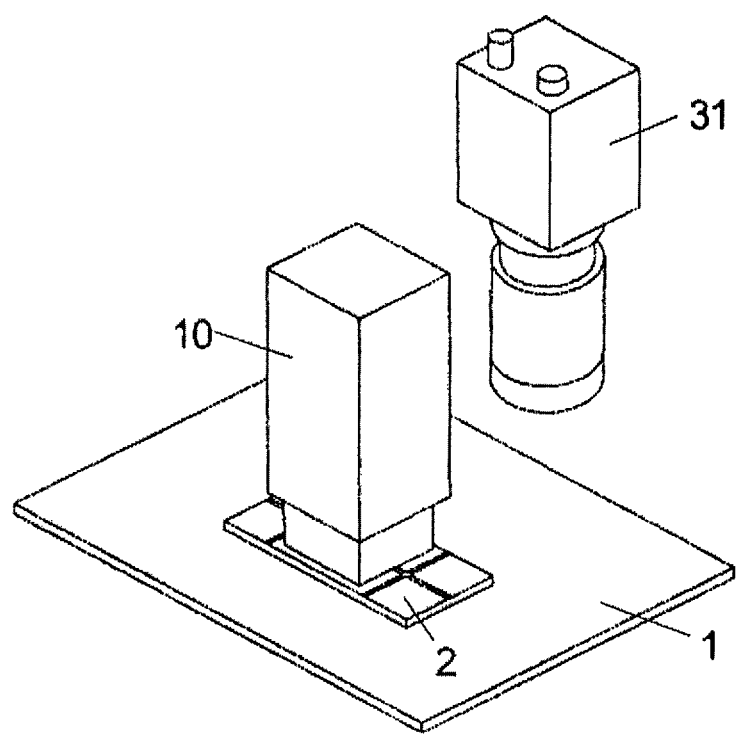
Figure 6F:
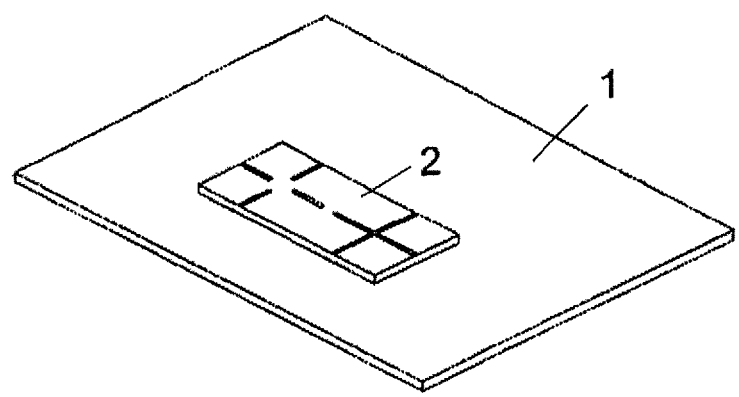

FIG. 6F depicts the final placement result.

Figure 7:
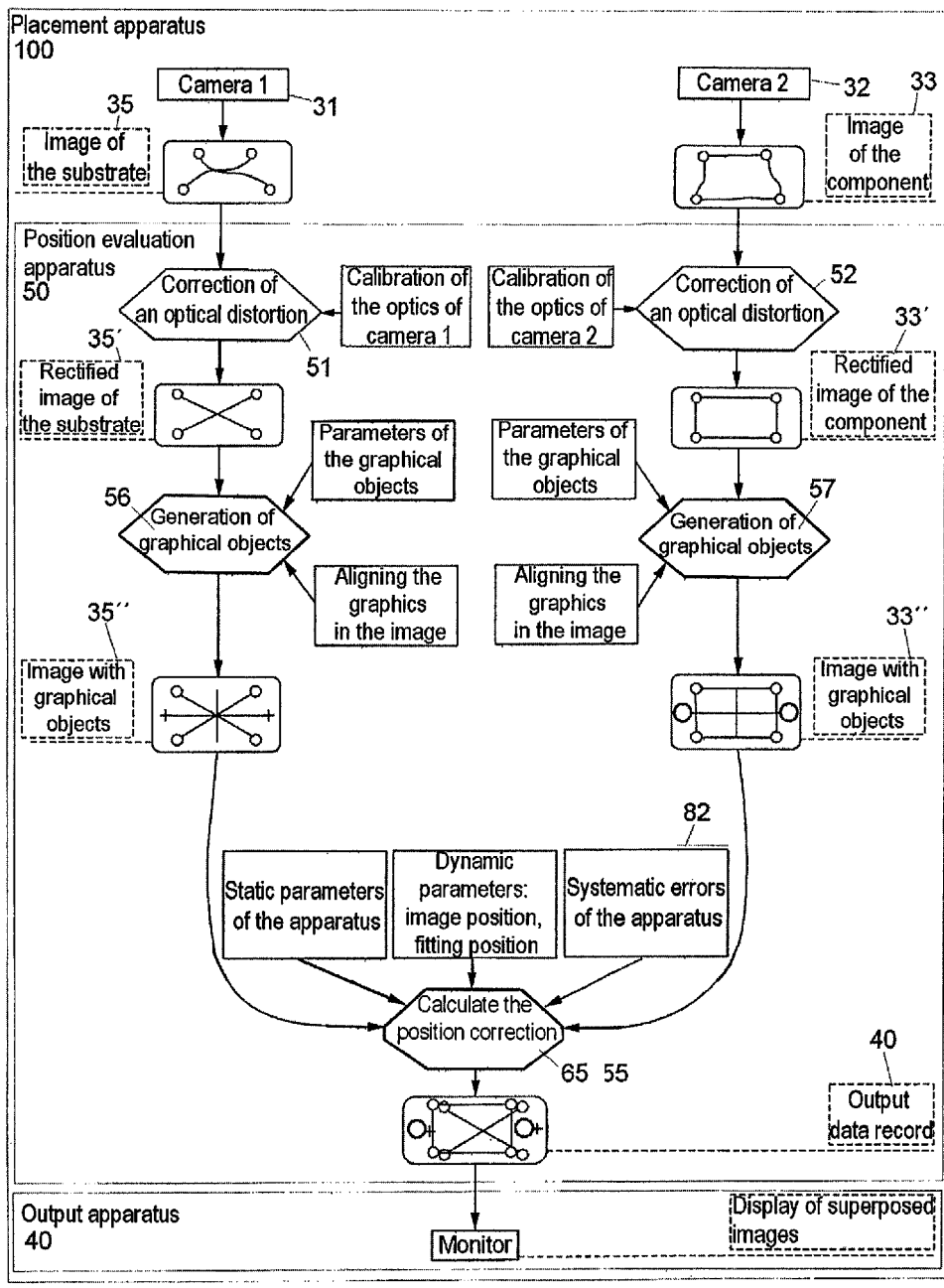
FIG. 7 shows an embodiment of a position evaluation apparatus with a means for generating and displaying graphical objects in the output data record.

FIG. 7 shows an embodiment of a placement apparatus comprising a location evaluation apparatus 50 comprising a means for displaying graphical objects in the output data record 40. To this end, corresponding objects are generated synthetically in the images of the placement partners and described by specific parameters. Advantageous synthetically generated geometric forms include, in particular, circles, rings, lines and crosses, and describing parameters include, in particular, size, position and color. So that the graphical objects have a suitable correlation with the image content, it is necessary to align these individually or as overall graphics relative to the image content. To this end, the placement apparatus 100 offers the possibility of undertaking the alignment by an installation operator, for example by displacing the graphics in the displayed images 35', 33'. Alternatively, there can be an automatic alignment of the graphics by applying the results of an image identification system. The introduced graphical objects may in this case also be imaged outside of the input image 35', 33'. In this case, the image is extended by the necessary region.

The use of graphical objects in the image is one option for identifying specific positions of the placement partners 1, 2, e.g. the contact centers of a component or the center position of a placement position on the substrate 1. Particularly in cases where the image content does not provide information, or does not provide sufficiently identifiable information, at the significant image points of the respective placement partner, it is possible to use graphical objects to compensate for this lack of image information. The application for additional display of graphical objects in the output data record 40 therefore expands the possibilities for evaluating the output data record 40 since, in addition to the image content, also the graphical objects can be assessed relative to the image content and/or the graphical objects can be assessed relative to one another.

It should be noted that synthetic objects need not necessarily be generated for both assembly partners. Usually, they are only helpful for one assembly partner.

FIGS. 8A to 8F contain an embodiment of a placement method which necessarily requires the graphical objects described in FIG. 7 for being able, in advance, to display to the machine operator the placement result to be expected in the form of suitably superposed images 41, 42.

FIG. 8 describes an embodiment of a placement method analogous to the one in FIG. 6, in which, however, the relative positions at which the individual images of component and substrate are recorded do not overlap. Therefore, the images of component and substrate can also never be directly superposed on one another, but rather the generation and use of graphical objects is additionally required.

Figure 8A:
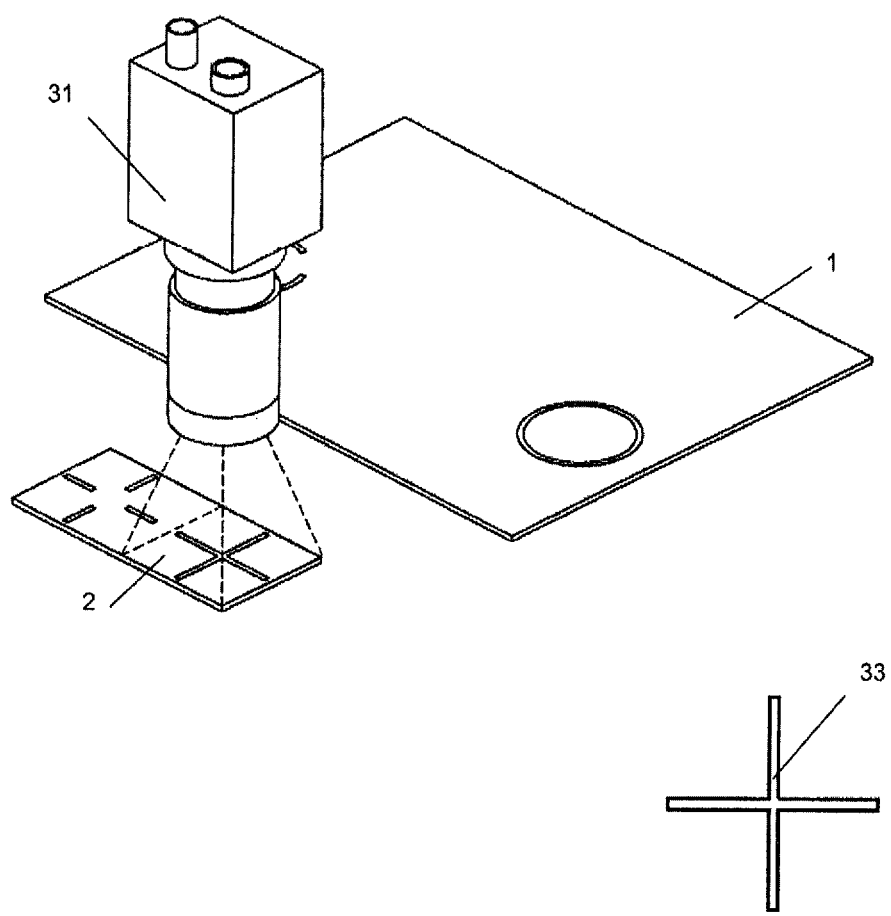
Figure 8B:
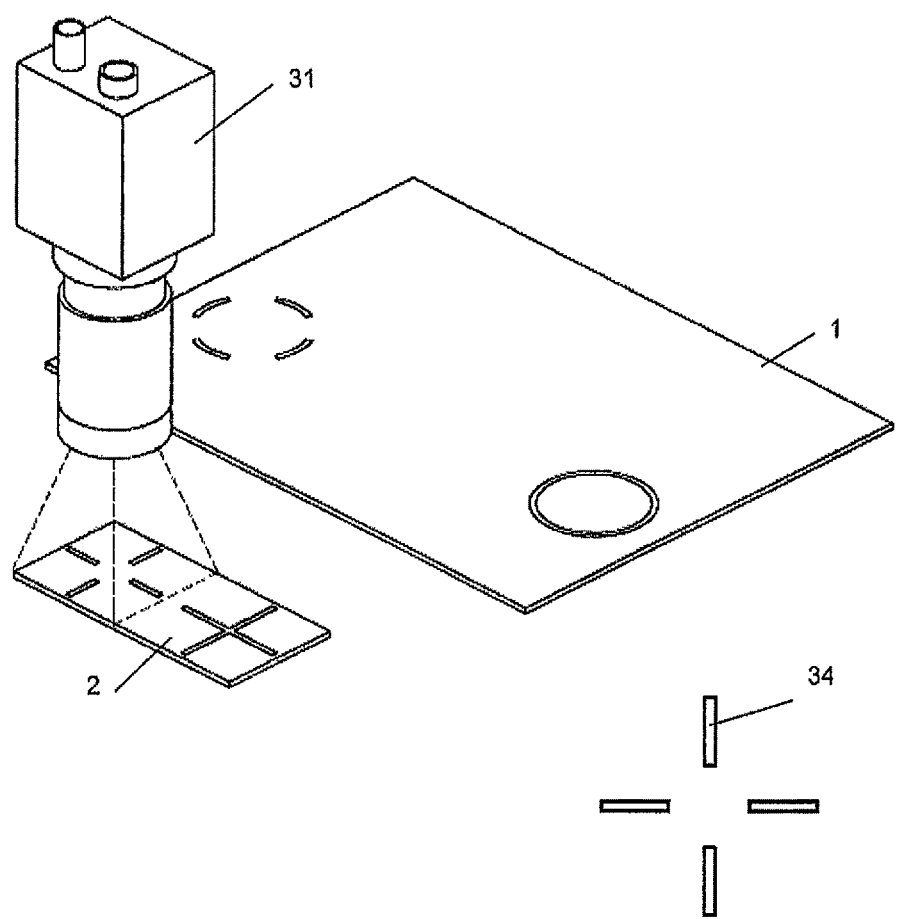

In FIGS. 8A and 8B, the camera apparatus 31, like in FIGS. 6A and 6B, records a first image 33 and a second image 34 of the component 2.

In FIG. 8C, a first recording of the substrate position is made by the camera apparatus 31 (from a first position).

However, no recorded image of the component is available for this position for superposition purposes because the component—like in the figure—is too small for this or because it does not have structures usable for identification purposes at the complementary position. Therefore, graphical objects are synthetically generated for the required substrate positions on the basis of the recorded images of the component 2 and on the basis of further parameters, wherein the images of the component 2 expand in terms of their extent.

The images of the component 2, expanded in terms of the dimensions and provided with the graphical ring structure, are subsequently fed to the algorithm for generating the output data record 40 together with the current image of the substrate 1. A first superposed image 41 emerges in the output data record 40.

In FIG. 8D, this process is then repeated at a second substrate position. Here, the superposition of the artificially generated objects and of the current substrate image results in a second superposed image 42.

Figure 8E:
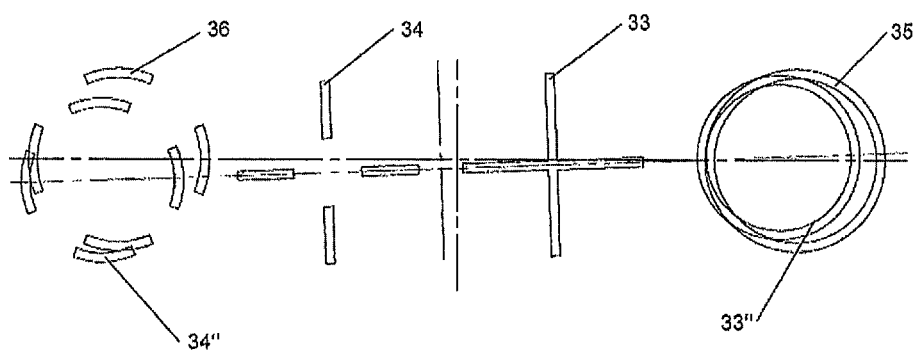
Figure 8F:
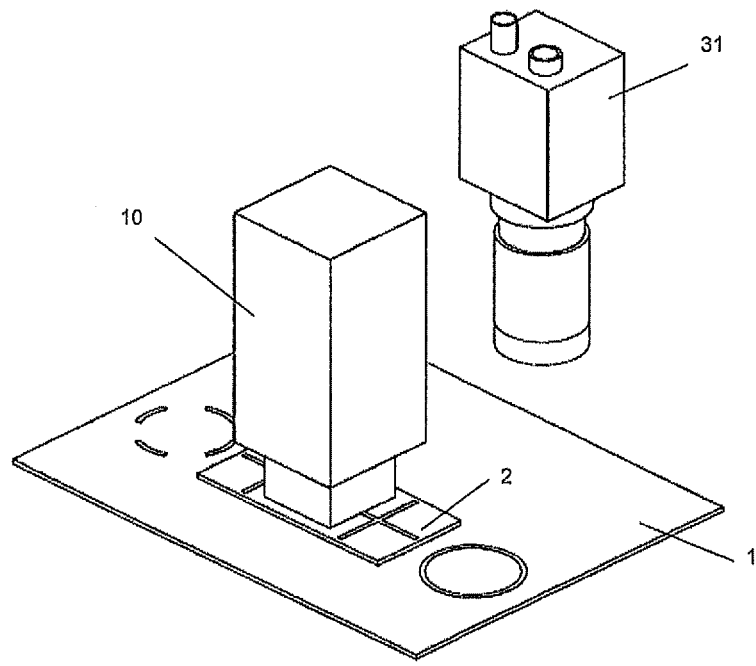

FIG. 8E depicts an output data record 40, wherein, in the superposition, the graphically generated rings from the component image 33", 34" are imaged in the recorded images of the substrate positions 35, 36. In the overall view, the position of the component 2 to be expected is also identifiable by way of the recorded component images 33, 34.

The output data record 40 can be depicted to the installation operator, once again in the totality thereof or in portions, as was described in this context using FIGS. 5 and 6, wherein, once again, all recorded images 33, 34 etc. may be subjected to corrections by correction means 81, 82.

Subsequently (FIG. 8F), the final placement position is traveled to and the placement unit 10 places the component 2 onto the substrate 1.

Figure 8G:
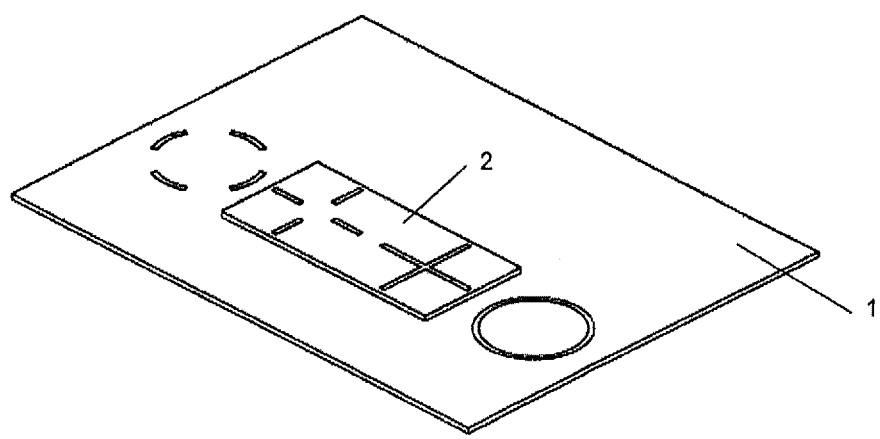

FIG. 8G depicts the final placement result.

FIG. 9 depicts a block diagram of an embodiment of a placement apparatus and a placement method to be carried out thereby for adjusting and aligning the position of the component 2 relative to the substrate 1 by updating the movable shafts of the adjustment apparatus. This can be implemented in a placement apparatus 100.

Here, the placement apparatus 100 can ensure the possibility for manual correction of the position and/or rotation of the component 2 and/or of the substrate 1, for example by a manual control operation (joystick) in the case of motor-driven adjustment apparatuses and/or by manually displacing and/or rotating the shafts of the adjustment apparatus by the operator. In this case, the means for the manual control operation e.g. constitute means for the spatial adjustment of the component 2 and/or the substrate 1.

The method recurrently generates a new output data record 40 with a superposed image of the component 2 in relation to the substrate 1 under application of the correction means as soon as one or more camera images change due to an adaptation of the adjusting.

In one advantageous embodiment, the calculation and display of the output data record 40 takes place in real time such that the operator identifies an immediate change in the adjusting thereof in the superposed image.

One embodiment of this method lies in recording one or more images of a component 2, for example in an apparatus in accordance with FIG. 1 or FIG. 2. Subsequently, there is updating of the at least one shaft while the camera apparatus 31 continuously records images of the placement position. The output data record 40 is generated in each case by the static images of the component 2 and the changing images of the substrate 1. Applying the correction means causes the user to have the impression of the currently expected placement result in the superposed images, even though the apparatus does not necessarily hold the component 2 in the placement position.

A second embodiment of this method according to FIG. 9 consists of recording one or more images of a substrate 1 and the subsequent adjustment during the continuous recording of images of the component 2. The function and effect are analogous to the embodiment described above, the only difference being that the output data record 40 is generated by the static images of the substrate 1 and by the changing images of the component 2 in each case.

A third embodiment of this method according to FIG. 9 consists of simultaneous continuous recording of images of a substrate 1 and of a component 2 during the adjustment. The function and effect are analogous to what was described above.

There can be a placement of the placement partners by the placement apparatus 100 after a positive evaluation of the output data record 40, i.e. the visual illustration of the relative position of the component 2 in relation to the substrate 1 is sufficiently accurate.

FIG. 10 depicts a block diagram of an embodiment of a placement apparatus 100 and a placement method to be carried out thereby for adjusting and aligning the position of the component 2 relative to the substrate 1 by aligning visual images of the placement partners 1, 2 in the output data record 40. To this end, initially, at least one image of a component 2 and at least one image of a substrate 1 are respectively recorded and fed to the method for generating the output data record 40 in accordance with FIG. 3, FIG. 4 or FIG. 7. However, in this embodiment the alignment is brought about by changing the parameters of the algorithm of the output data record 40. By way of example, a suitable form could be the displacement of a partial image in the display of the superposed image with the aid of a computer mouse or the discrete editing of values in input masks. Every change of the parameters starts a new calculation of the output data record 40, which is subsequently depicted. Therefore, the installation operator is imparted with the impression that he is able to mutually align the visual images of the component 2 and of the substrate 1 in the superposed image. It should be noted that the apparatus need not be moved to this end and the algorithm always operates with the images recorded at the outset. An automatic adjustment of the placement partners 1, 2 by the placement apparatus 100 is brought about after a positive evaluation of the output data record 40, i.e. when the visual illustration of the relative position of the component 2 in relation to the substrate 1 is sufficiently accurate. To this end, the last valid parameters in relation to the position of the visual images of the component 2 and of the substrate 1 are converted in a suitable form to movement coordinates of the placement apparatus 100 and applied. Placement can follow subsequently.

What is common to all described methods is that an output data record 40 in the form of superposed images is offered to the installation operator. Using this, a number of advantages can be obtained, which will be mentioned below.

Thus, a simple pattern fitting without complicated programming in advance is made possible. The installation operator sees the result to be expected "live" and can fit the pattern in a "manual mode": the installation operator moves the component 2 "live" to the correct position of the substrate such that it is possible to dispense with complicated programming of the positions and the image identification. Here, aligning can be realized by applying the methods in accordance with FIG. 9 or in accordance with FIG. 10.

Furthermore, possible fitting errors of the machine already become visible before placing the component 2 because an installation operator is able trace back placement errors that are visible in the image superposition to incorrect programming in the process program of the machine, in particular of the placement position, and able to correct these where necessary.

Significant amounts of time can be saved during the process program generation compared to the conventional way of only using geometry data/drawings.

Assembly errors are visually identifiable before the actual assembly has been carried out. These can primarily be caused by other errors of the assembly partners, for example if a component 2 in the storage region 20 is supplied rotated by 90°, when an incorrect component 2 which, however, has a very similar geometry is supplied, by too much stretching of flexible assembly partners, e.g. plastic films.

LIST OF REFERENCE SIGNS

1 First placement partner, substrate
2 Second placement partner, component
2' Second component
2" Third component
2''' Fourth component, alignment structures on the top side
3 Holding apparatus for component
10 Placement unit
11 Portal
20 Base, holding apparatus for substrate
22 Storage region for components
31 First camera apparatus, substrate camera apparatus
32 Second camera apparatus, component camera apparatus
33 (First) recorded image of the component
33' Corrected image of the component
33" Image of the component with graphical objects
34 Second recorded image of the component
34" Second image of the component with graphical objects
35 (First) image of the substrate
35' Corrected image of the substrate
35" Image of the substrate with graphical objects
36 Second recorded image of the substrate
36' Corrected second image of the substrate
40 Output data record
41 First superposed image of the output data record
42 Second superposed image of the output data record
50 Position evaluation apparatus
51 Correction step for an image of the substrate
52 Correction step for an image of the component
55 Calculation of the output data record
56 Generation of graphical objects in the image of the substrate
57 Generation of graphical objects in the image of the component
60 Image identification system
61 Image identification of the substrate
62 Image identification of the component
63 Position correction data of the substrate
64 Position correction data of the component
65 Calculating the position correction data relative to the placement position
66 Position correction data of both placement partners
67 Automatic position correction
70 Output apparatus
81 First correction means
82 Second correction means
100 Placement apparatus
X,Y,Z Movement options in spatial directions
βx,βy,βz Movement options about spatial axes

The invention claimed is:

1. A placement apparatus for aligning or fitting a first placement partner with at least one second placement partner complementary thereto, comprising:

at least one camera apparatus configured to record separate images at different times of the first placement partner or of a holding apparatus of the first placement partner and of the at least one second placement partner or of a holding apparatus for the at least one second placement partner, a position evaluation apparatus for creating an output data record from processing the images, wherein the output data record has a visual image of an expected placement result, namely comprising an image, which consists of a multitude of superposed images based on the status of the placement apparatus at the respective point in time at which each image was taken, an adjustment apparatus for the mutual relative alignment of the first placement partner and the at least one second placement partner in at least one spatial direction or rotational direction, a second corrector configured to calculatively combine mechanical errors of the placement apparatus with calibration data, and an adjustor configured to spatially align and adjust the first placement partner or the at least one second placement partner depending on an evaluation of the output data record, wherein the output data record is generated and displayed in real time such that an installation operator can align the placement partners interactively based on the visual image of the expected placement result.

2. The placement apparatus as claimed in claim 1, wherein the first placement partner has a substrate and the at least one second placement partner has at least one component.

3. The placement apparatus as claimed in claim 2, wherein the at least one camera apparatus comprises a second camera apparatus configured to record images of the second placement partner and a first camera apparatus configured to record images of at least the first placement partner.

4. The placement apparatus as claimed in claim 1, wherein the at least one camera apparatus comprises a second camera apparatus configured to record images of the second placement partner and a first camera apparatus configured to record images of at least the first placement partner.

5. The placement apparatus as claimed in claim 1, further comprising a first corrector configured to correct the images of the at least one camera apparatus by calibration data for minimizing imaging errors.

6. The placement apparatus as claimed in claim 1, further comprising a generator and display configured to generate and display graphical objects, wherein the graphical objects are aligned to content of the recorded images.

7. The placement apparatus as claimed in claim 6, wherein the generator and the display are configured to generate and display the graphical objects in the output data record in real time such that the installation operator can align the placement partners interactively based on the visual image of the expected placement result.

8. The placement apparatus as claimed in claim 1, further comprising an adjustor configured to align and adjust the visual images of the first placement partner or the at least one second placement partner in the output data record.

9. The placement apparatus as claimed in claim 1, wherein results of an automatic image identification system coupled to the placement apparatus are also processed when creating the output data record.

10. The placement apparatus as claimed in claim 1, further comprising a processor configured to join the first and second placement partners.

11. The placement apparatus as claimed in claim 10, wherein the processor is configured to join the placement partners by thermocompression, ultrasonic methods, soldering and/or adhesive bonding.

12. A placement method for a placement apparatus for aligning or fitting a first placement partner with at least one second placement partner complementary thereto, comprising:
  a) respectively recording at different times, with at least one camera apparatus, at least two separate images of the first placement partner or of a holding apparatus of the first placement partner and of the at least one second placement partner or of a holding apparatus of the at least one second placement partner;
  b) creating, with a position evaluation apparatus, an output data record by processing the at least two separate images, wherein the output data record has a visual image of an expected placement result, namely comprising an image, which consists of a multitude of superposed images based on the status of the placement apparatus at the respective point in time at which each image was taken;
  c) mutually relatively aligning, with an adjustment apparatus, the first placement partner and the at least one second placement partner in at least one spatial direction or rotational direction;
  d) calculatively combining, with a second corrector, mechanical errors of the placement apparatus with calibration data; and
  e) spatially aligning and adjusting, with an adjustor, the first placement partner or the at least one second placement partner depending on an evaluation of the output data record,
  wherein the output data record is generated and displayed in real time such that an installation operator can align the placement partners interactively based on the visual image of the expected placement result.

13. The placement method as claimed in claim 12, further comprising spatially setting the at least one second placement partner, or the first placement partner, depending on an evaluation of the output data record.

14. The placement method as claimed in claim 13, setting the visual images of the first and second placement partners in the output data record.

15. The placement method as claimed in claim 13, wherein the first placement partner comprises at least one substrate.

16. The placement method as claimed in claim 13, wherein the second placement partner comprises at least one component.

17. The placement method as claimed in claim 12, further comprising setting the visual images of the first and second placement partners in the output data record.

* * * * *